United States Patent
Hsu

(10) Patent No.: US 8,060,809 B2
(45) Date of Patent: Nov. 15, 2011

(54) EFFICIENT CHIEN SEARCH METHOD AND SYSTEM IN REED-SOLOMON DECODING

(75) Inventor: Yueh-Teng Hsu, Taipei (TW)

(73) Assignee: Lite-On Technology Corp., Taipei (TW)

( * ) Notice: Subject to any disclaimer, the term of this patent is extended or adjusted under 35 U.S.C. 154(b) by 1055 days.

(21) Appl. No.: 11/976,473

(22) Filed: Oct. 25, 2007

(65) Prior Publication Data

US 2009/0055716 A1   Feb. 26, 2009

(30) Foreign Application Priority Data

Aug. 24, 2007   (TW) .............................. 96131490 A

(51) Int. Cl.
    *H03M 13/03*   (2006.01)
(52) U.S. Cl. ........................................ 714/784; 714/759
(58) Field of Classification Search .................. 714/759, 714/779, 780, 781, 784
    See application file for complete search history.

(56) References Cited

U.S. PATENT DOCUMENTS

| | | | |
|---|---|---|---|
| 5,970,075 A * | 10/1999 | Wasada ........................ | 714/784 |
| 6,263,470 B1 | 7/2001 | Hung et al. | |
| 7,539,927 B2 * | 5/2009 | Lee et al. ...................... | 714/784 |

OTHER PUBLICATIONS

Truong, T.-K.; Jeng, J.-H.; Reed, I.S.; , "Fast algorithm for computing the roots of error locator polynomials up to degree 11 in Reed-Solomon decoders," Communications, IEEE Transactions on , vol. 49, No. 5, pp. 779-783, May 2001 doi: 10.1109/26.923801URL: http://ieeexplore.ieee.org/stamp/stamp.jsp?tp=&arnumber=923801&isnumber=19976.*

Qingsheng Hu; Zhigong Wang; Jun Zhang; Jie Xiao; , "Low complexity parallel Chien search architecture for RS decoder," Circuits and Systems, 2005. ISCAS 2005. IEEE International Symposium on , vol., No., pp. 340-343 vol. 1, May 23-26, 2005 doi: 10.1109/ISCAS.2005.1464594.*

* cited by examiner

*Primary Examiner* — Cynthia Britt
(74) *Attorney, Agent, or Firm* — Rosenberg, Klein & Lee

(57) ABSTRACT

An efficient Chien search method in Reed-Solomon decoding is adapted for use in a processor having a parallel processing instruction set. The method includes the following steps: (a) if an error location polynomial that has been found matches a preset condition, finding at least one error symbol location directly through table lookup; (b) if the error location polynomial does not match the preset condition, executing steps (c) to (e); (c) calculating an error evaluation value; (d) if the error evaluation value is equal to 0, storing an error symbol location in an error location memory; and (e) if the error evaluation value is not equal to 0, the flow returning to step (c).

12 Claims, 6 Drawing Sheets

FIG. 5

EFFICIENT CHIEN SEARCH METHOD AND SYSTEM IN REED-SOLOMON DECODING

CROSS-REFERENCE TO RELATED APPLICATION

This application claims priority of Taiwanese Application No. 096131490, filed on Aug. 24, 2007.

BACKGROUND OF THE INVENTION

1. Field of the Invention

The invention relates to a Chien search method in Reed-Solomon decoding, more particularly to a Chien search method and system in Reed-Solomon decoding, which can directly find an error symbol location through table lookup so as to enhance efficiency.

2. Description of the Related Art

In recent years, demand for reliable signal transmission with respect to products ranging from consumer electronic products to communications electronic products has increased considerably. Therefore, error detection and correction mechanisms are becoming more and more important. During the process of digital communication, to ensure the accuracy of source data to be transmitted, a transmitting end generally will append redundant data to the source data, so that the receiving end can perform error correction based on the redundant data. The Reed-Solomon code is a widely used correction code. Since the Reed-Solomon code has a good correction capability with respect to errors generated in transmission channels, it has become a very popular channel coding scheme, and is now a widely used error correction code in satellite communication systems, digital television systems, various digital audiovisual recording media, etc.

Even though the Reed-Solomon code has excellent performance in error correction, the amount of computations required for decoding is huge. Consequently, hardware is often used for calculation and processing. If the Reed-Solomon code is executed in a processor in the form of program decoding, the decoding speed will inevitably become extremely slow due to the huge computation amount. Therefore, in some applications of communications devices with software-defined operations (such as software defined radio (SDR)), accelerating the program decoding speed of the Reed-Solomon code has become an important subject of research.

Referring to FIG. 1, an existing Reed-Solomon decoding procedure can be divided into four stages, which are, as shown, a stage 11 of calculating syndromes, a stage 12 of calculating error location polynomials, a stage 13 of executing a Chien search, and a stage 14 of calculating error values. In this Reed-Solomon decoding procedure, about 40% of the computation amount is concentrated on the Chien search at stage 13. If the processing time for executing the Chien search can be effectively reduced, the decoding speed of the Reed-Solomon code can be successfully accelerated.

Referring to FIG. 2, a conventional Chien search method in Reed-Solomon decoding includes the following steps. In step 21, a location index j and a symbol index i are initialized, i.e., j=0, and i=0. In step 22, an error evaluation value $\Lambda(\alpha^i)$ is calculated. In step 23, a decision is performed to determine if the error evaluation value $\Lambda(\alpha^i)$ is equal to 0. If yes, this indicates that an error occurs in a symbol at the $i^{th}$ position, and step 24 is carried out to perform the necessary processing. Otherwise, the flow goes to the processing in step 26. In steps 24 and 25, the current symbol index i is first stored in an error location array, Location[j]=i, followed by incrementing the location index, j=j+1. In steps 26-27, a decision is performed to determine if the Chien search has been completed, i.e., determining if i=n−1. If yes, the Chien search is ended. Otherwise, the symbol index i is incremented, i=i+1, and the aforesaid steps are repeated, in which n represents a total number of symbols of a Reed-Solomon block code that was received. In this conventional method, the finite field multiplication, the finite field addition, and the subsequent comparison and determination processing which are required to calculate the error evaluation value involve very time-consuming computations.

Another conventional Chien search method in Reed-Solomon decoding is disclosed in U.S. Pat. No. 6,263,470, in which a finite field multiplication result required for calculating the error evaluation value $\Lambda(\alpha^i)$ is found from a predefined finite field multiplication result table so as to reduce the time required for executing the aforesaid step 22. However, this conventional method merely reduces the time for computing the finite field multiplication. It is still required to perform the finite field addition and the subsequent comparison and determination processing. Thus, there is room for improvement.

Accordingly, there is a need to find a solution such that the time for processing the Chien search can be further reduced, thereby increasing the speed of decoding the Reed-Solomon Code.

SUMMARY OF THE INVENTION

Therefore, a primary object of the present invention is to provide an efficient Chien search method in Reed-Solomon decoding, which is adapted for use in a processor having a parallel processing instruction set.

Accordingly, the efficient Chien search method in Reed-Solomon decoding of this invention comprises the following steps: (a) if an error location polynomial that has been found matches a preset condition, finding at least one error symbol location directly through table lookup; (b) if the error location polynomial does not match the preset condition, executing steps (c) to (e); (c) calculating an error evaluation value; (d) if the error evaluation value is equal to 0, storing the error symbol location in an error location memory; and (e) if the error evaluation value is not equal to 0, the flow returning to step (c).

Another object of the present invention is to provide an efficient Chien search system adapted for use in a processor having a parallel processing instruction set for performing a Chien search.

Accordingly, the efficient Chien search system of the present invention comprises a first determining module, a table lookup module, an error evaluation module, a second determining module, and a memory write module. The first determining module is used to determine whether an error location polynomial that has been found matches a preset condition. The table look-up module is used to find at least one error symbol location according to the error location polynomial directly through table lookup when the first determining module determines a match with the preset condition. The error evaluation module is used to calculate an error evaluation value according to the error location polynomial when the first determining module determines no match with the preset condition. The second determining module is used to determine whether the error evaluation value is equal to 0. The memory write module is used to store an error symbol location in an error location memory when the error evaluation value is determined by the second determining module to be equal to 0.

The present invention employs table lookup to directly find error symbol locations, so that the time for processing a Chien search can be further reduced to thereby increase the speed of decoding the Reed-Solomon code.

BRIEF DESCRIPTION OF THE DRAWINGS

Other features and advantages of the present invention will become apparent in the following detailed description of the preferred embodiment with reference to the accompanying drawings, of which:

FIG. 5 is illustrates a first error location table and a second error location table.

DETAILED DESCRIPTION OF THE PREFERRED EMBODIMENT

Figure 1:
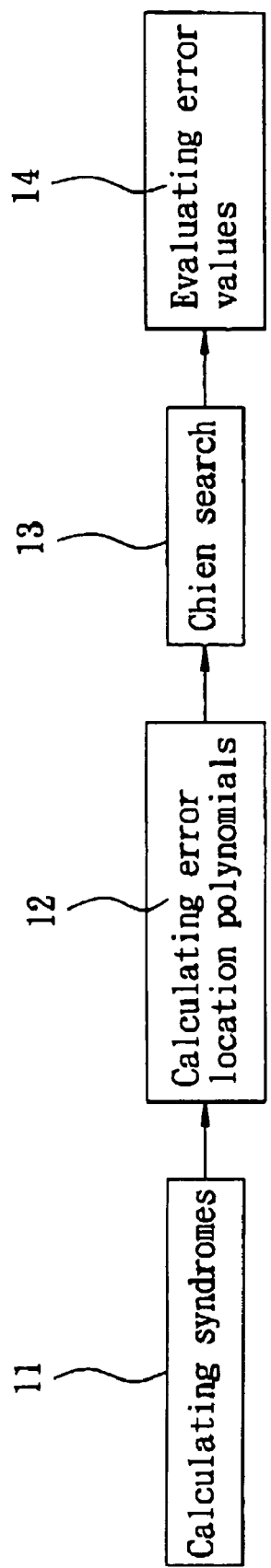
FIG. 1 is a flow diagram to illustrate a conventional Reed-Solomon decoding procedure.
Figure 2:
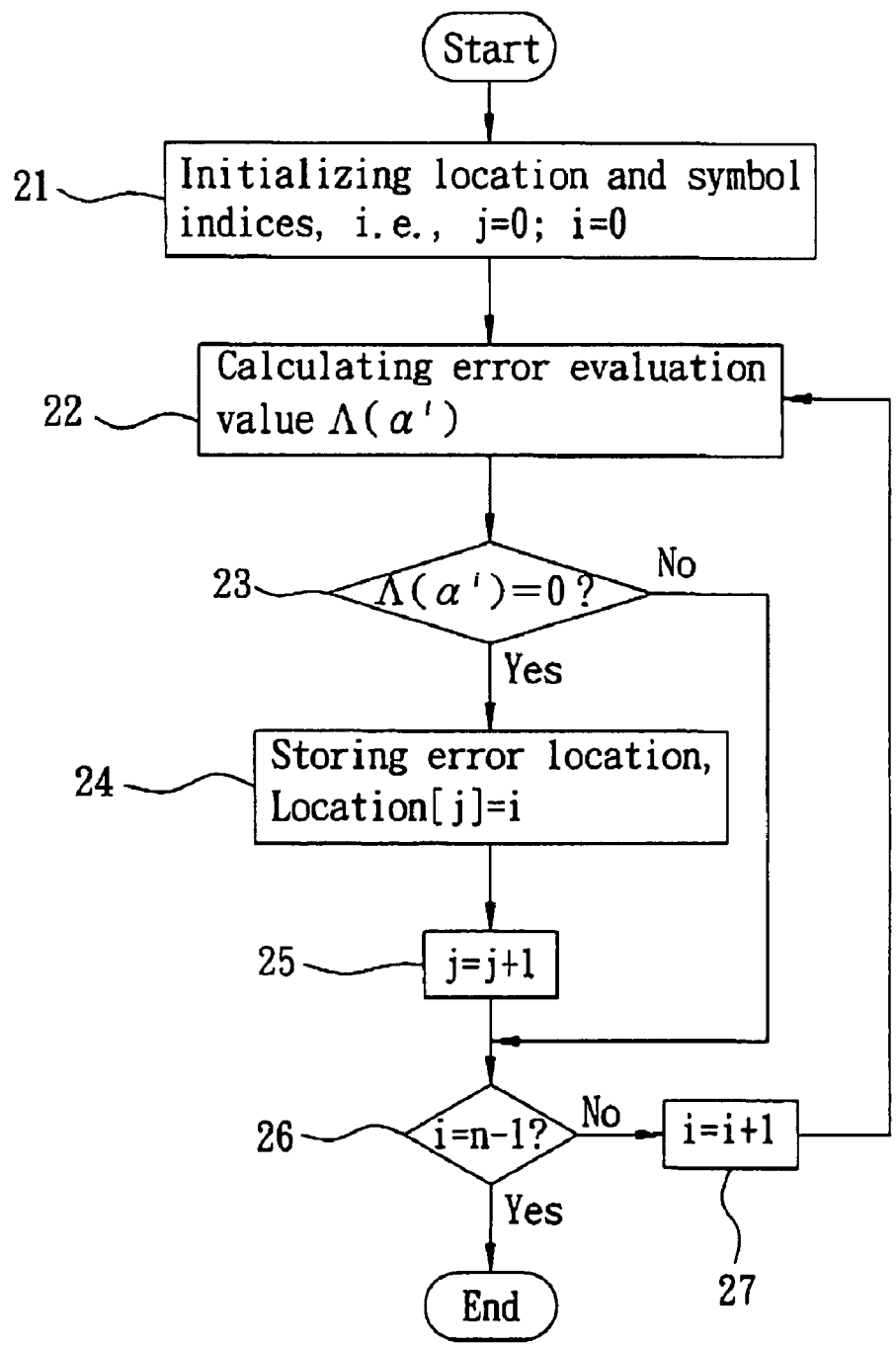
FIG. 2 is a flowchart to illustrate a conventional Chien search method in Reed-Solomon decoding.

Referring back to FIG. 1, as mentioned hereinbefore, the Reed-Solomon decoding procedure includes stages 11, 12, 13, and 14. In stage 11, the purpose of calculating syndromes is to determine if the received signal has been contaminated by noise. If the result of syndrome calculation is 0, this indicates that the signal has not been contaminated (i.e., the received signal is correct). Otherwise, processing in stages 12 to 14 must be continued. In stage 12, a Berlekamp-Massey algorithm is used to calculate an error location polynomial. In stage 13, a Chien search is conducted according to the error location polynomial to find at least one error symbol location. In stage 14, at least one error value is found, and the error value is subtracted at an appropriate error symbol location so as to recover the correct signal.

In general, a Reed-Solomon block code is represented by Reed-Solomon (n,k), where n represents the total number of symbols of each block after encoding, k represents the number of source message symbols of each encoded block, and t=(n−k)/2, t representing the maximum number of correctable errors. For example, a digital video broadcasting (DVB) system of the European specification adopts Reed-Solomon (204,188). That is, there are altogether 204 symbols in the Reed-Solomon block code, the number of encoded source message symbols is 188, and the maximum number of correctable errors is 8.

Suppose the Reed-Solomon block code received is as expressed in the following Equation (1):

$$r=r_0+r_1+r_2+\ldots+r_i+\ldots+r_{n-1} \quad (1)$$

where i is a symbol index, and $r_i$ represents the $i^{th}$ symbol in the Reed-Solomon block code.

Using the Berlekamp-Massey algorithm, the number of symbols in which errors occur, and an error location polynomial can be found. Supposing there are altogether d symbols in which errors occur (i.e., the length of the error location polynomial is d), the error location polynomial thus calculated is as expressed in the following Equation (2):

$$\Lambda(\alpha^i)=\lambda_0+\lambda_1\alpha^i+\lambda_2\alpha^{2i}+\lambda_3\alpha^{3i}+\ldots+\lambda_d\alpha^{di} \quad (2)$$

where $d \leq t$.

For each symbol $r_i$, a corresponding error evaluation value $\Lambda(\alpha^i)$ is calculated. The calculation is expressed in the following Equation (3):

$$\Lambda(\alpha^0) = \lambda_0 + \lambda_1\alpha^0 + \lambda_2\alpha^0 + \lambda_3\alpha^0 + \ldots + \lambda_d\alpha^0 \quad (3)$$

$$\Lambda(\alpha^1) = \lambda_0 + \lambda_1\alpha^1 + \lambda_2\alpha^2 + \lambda_3\alpha^3 + \ldots + \lambda_d\alpha^d$$

$$\vdots$$

$$\Lambda(\alpha^{n-1}) = \lambda_0 + \lambda_1\alpha^{n-1} + \lambda_2\alpha^{2n-2} + \lambda_3\alpha^{3n-3} + \ldots + \lambda_d\alpha^{d(n-1)}$$

If the error evaluation value $\Lambda(\alpha^i)$ thus calculated is 0, this indicates that an error has occurred in the symbol $r_i$. Otherwise, this indicates that the symbol $r_i$ is correct.

Since the principles of encoding and decoding in the Reed-Solomon code and the finite field operations are constructed on the Galois field $GF(2^m)$, where ($2^m$) represents the total number of corresponding elements in the Galois field, the finite field operation for the error evaluation value $\Lambda(\alpha^i)$ in Equation (3) herein is a Galois field operation.

Figure 3:
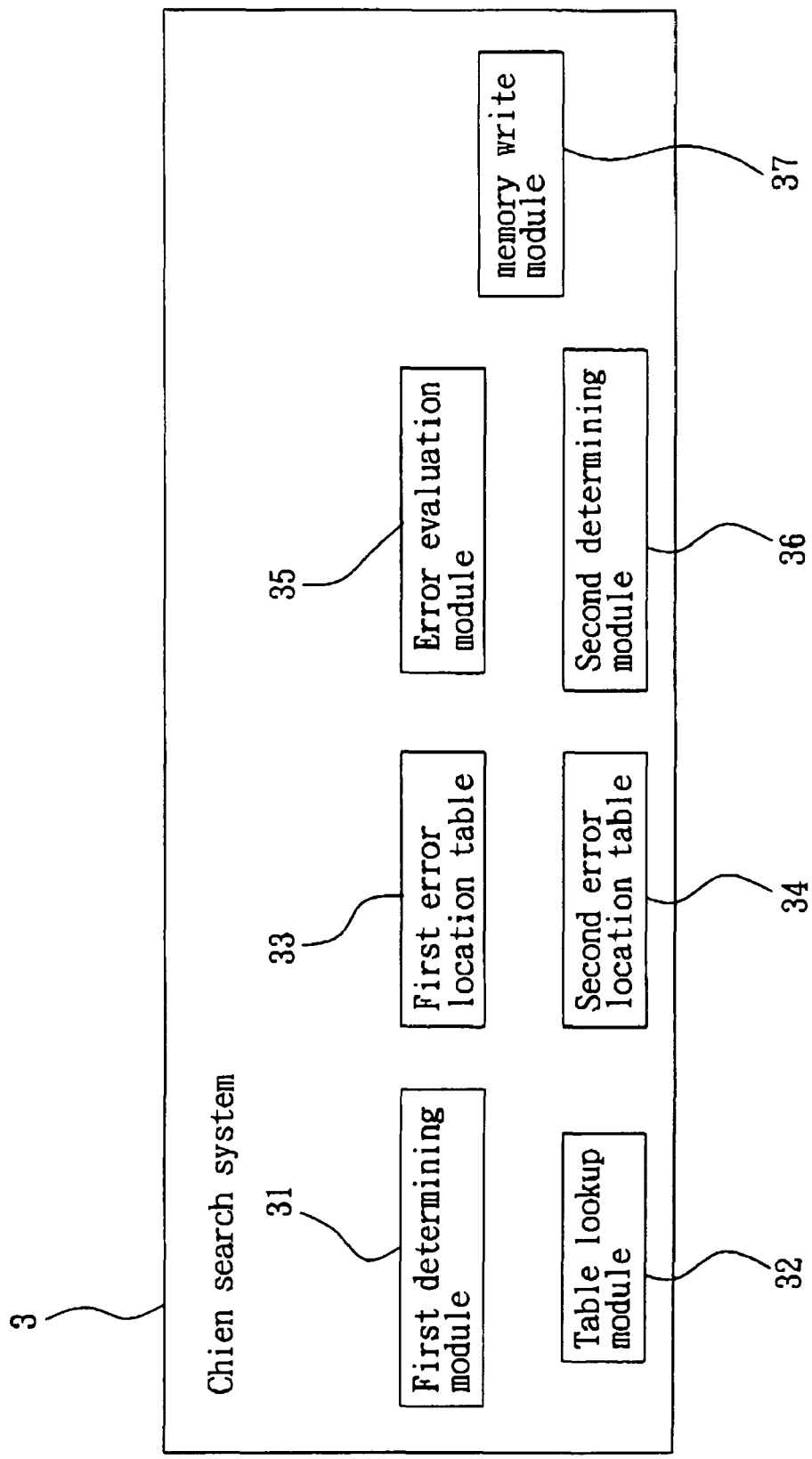
FIG. 3 is a system block diagram to illustrate a preferred embodiment of an efficient Chien search system used in Reed-Solomon decoding according to the present invention.

Referring to FIG. 3, the preferred embodiment of an efficient Chien search system 3 for Reed-Solomon decoding according to the present invention is shown to include a first determining module 31, a table look-up module 32, a first error location table 33, a second error location table 34, an error evaluation module 35, a second determining module 36, and a memory write module 37. The first determining module 31 is used to determine whether an error location polynomial that has been found matches a preset condition. The table look-up module 32 is used to find at least one error symbol location according to the error location polynomial directly through table lookup when the first determining module 31 determines a match with the preset condition. The error evaluation module 35 is used to calculate an error evaluation value according to the error location polynomial when the first determining module 31 determines no match with the preset condition. The second determining module 36 is used to determine whether the error evaluation value is equal to 0. The memory write module 37 is used to store an error location symbol in an error location memory when the error evaluation value is determined by the second determining module 36 to be equal to 0. The system 3 and the various modules thereof can be realized by means of a software program which, when loaded into a processor having a parallel processing instruction set, can be used to implement the efficient Chien search method in Reed-Solomon decoding according to the present invention.

In the preferred embodiment, the method is executed in an x86 processor having a SSE2 instruction set. However, the method can also be executed in a digital signal processor (DSP), a general purpose processor, or a central processing unit (CPU) having a similar parallel processing instruction set. Thus, implementation of the present invention should not be limited to the preferred embodiment illustrated herein.

The efficient Chien search method in Reed-Solomon decoding according to the present invention includes the following steps.

Figure 5:
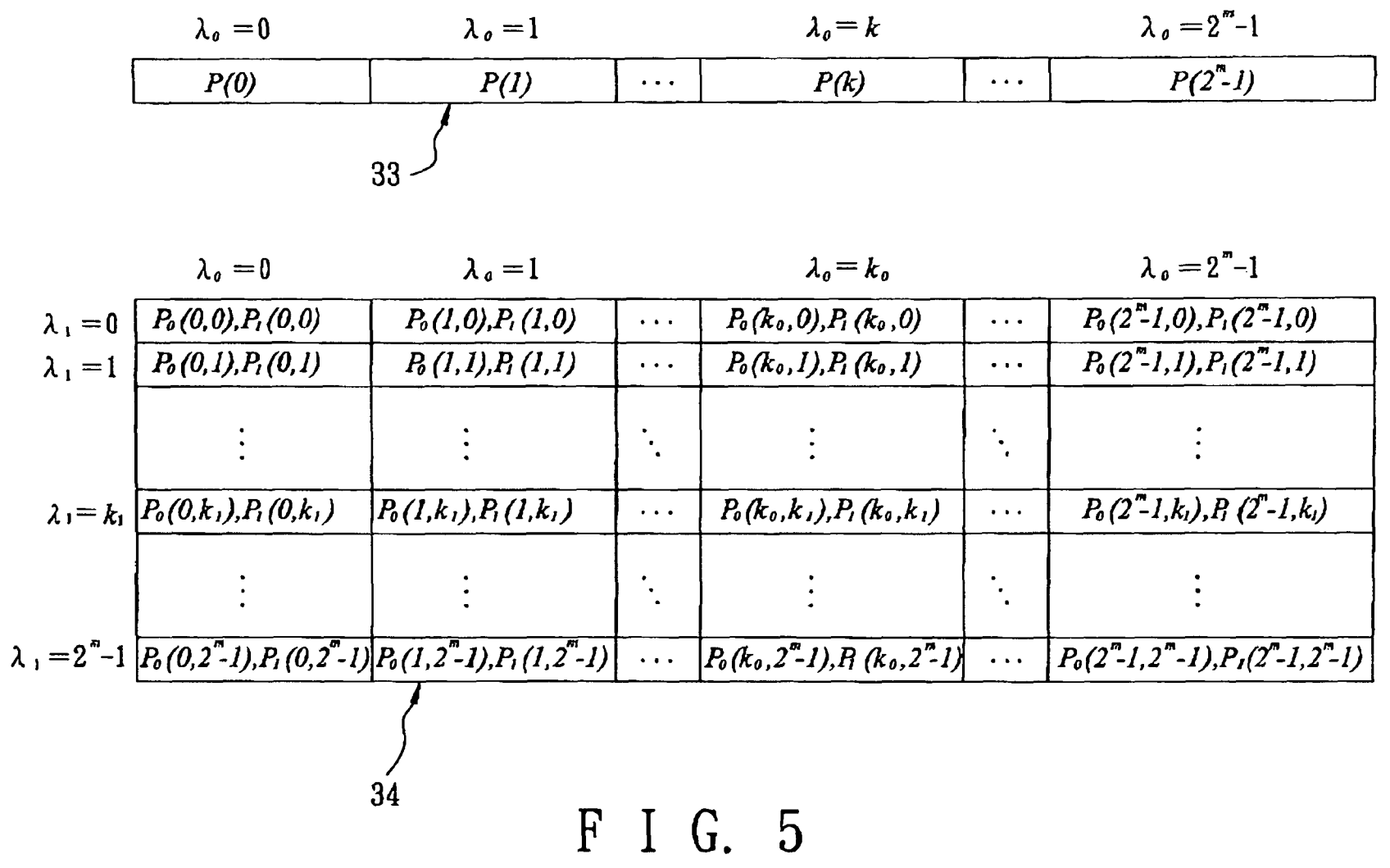

Referring to FIG. 5, prior to performing the following steps, it is necessary to construct the first error location table 33 and the second error location table 34.

Supposing an error location polynomial with length equal to 1 (i.e., d=1, the number of the error symbol location is 1) is expressed as: $\Lambda(\alpha^i)=\lambda_0$, where $\lambda_0 \in GF(2^m)$, the corresponding content in the first error location table 33 is: P(k) and $0 \leq k < 2^m$, P(k) representing the error symbol location previously found when $\lambda_0 = k$. Supposing the error location polynomial with length equal to 2 (i.e., d=2, the number of the error symbol location is 2) is expressed as: $\Lambda(\alpha^i) = \lambda_0 + \lambda_1 \alpha^i$, where $\lambda_0, \lambda_1 \in GF(2^m)$, the corresponding content in the second error location table 34 is: $P_0(k_0, k_1)$ and $P_1(k_0, k_1)$, and $0 \leq k_0$, $k_1 < 2^m$. $P_0(k_0, k_1)$ and $P_1(k_0, k_1)$ respectively represent the two error symbol locations previously found when $\lambda_0 = k_0, \lambda_1 = k_1$.

Generally, the symbols to be processed are supposed to be 8-bit in size. If m is set to be equal to 8, then $\lambda_0, \lambda_1 \in GF(2^8) = GF(256) = \{0, 1, 2, \ldots, 255\}$. The first error location table 33 and the second error location table 34 are, respectively, $2^8$ bytes and $2^8 \times 2^8 \times 2$ bytes.

Figure 4:
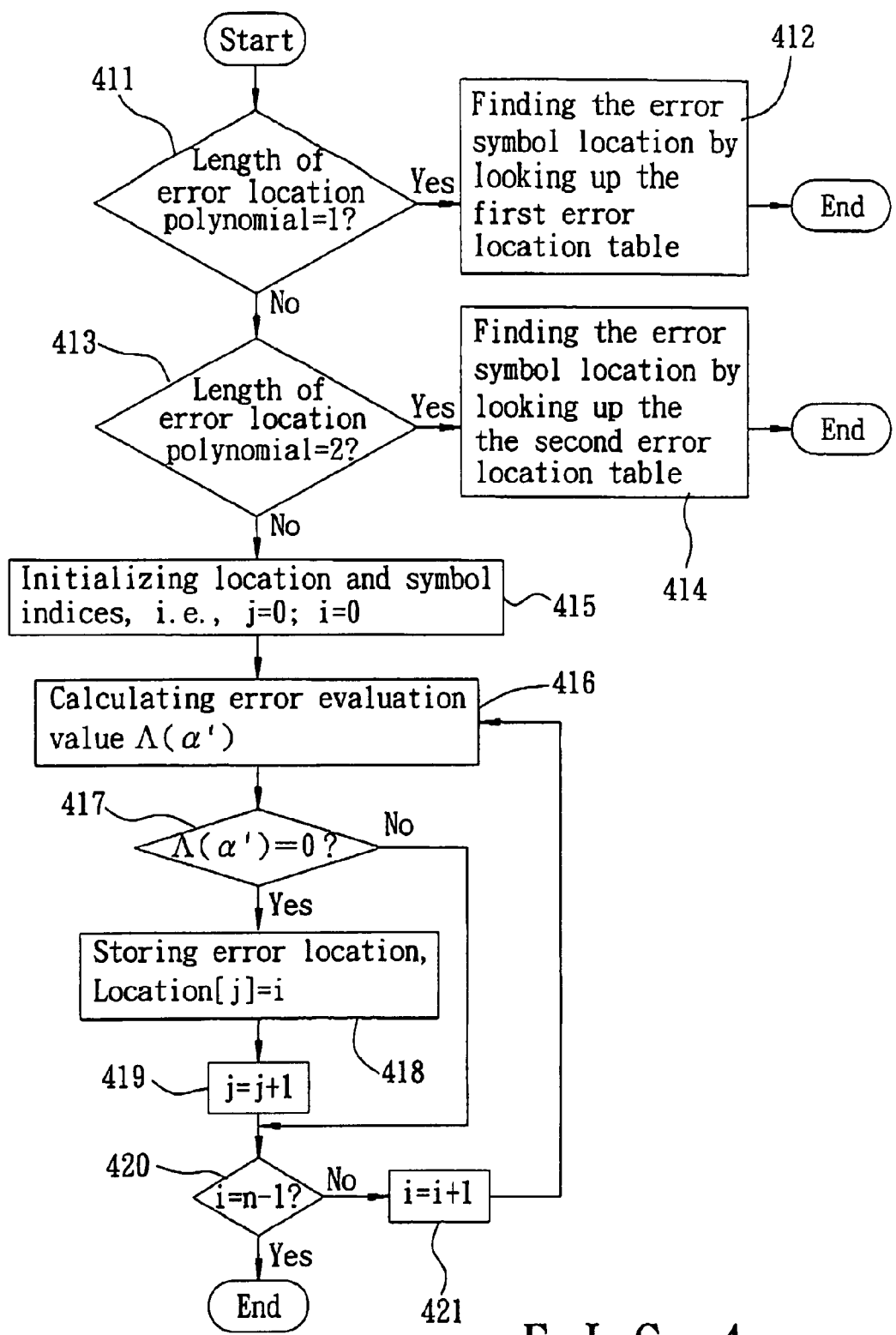
FIG. 4 is a flowchart to illustrate the preferred embodiment of an efficient Chien search method in Reed-Solomon decoding according to the present invention.

Referring to FIGS. 3, 4 and 5, in steps 411 to 412, the first determining module 31 determines whether the length d of the error location polynomial is equal to a first predetermined value (which is set to be 1 in this preferred embodiment). In the affirmative, the table look-up module 32 finds the error symbol location according to the error location polynomial directly by looking up the first error location table 33, and the Chien search is ended. Otherwise, step 413 is executed.

In steps 413 to 414, the first determining module 31 determines whether the length d of the error location polynomial is equal to a second predetermined value (which is set to be 2 in this preferred embodiment). In the affirmative, the table took-up module 32 finds the two corresponding error symbol locations $P_0(k_0, k_1)$ and $P_1(k_0, k_1)$ according to the error location polynomial directly from the second error location table 34, and the Chien search is ended. Otherwise, step 415 is executed.

Steps 415 to 421 are similar to those in a conventional Chien search method, and are briefly described as follows:

In step 415, a location index j and a symbol index i are initialized by the Chien search system 3, i.e., j=0, and i=0.

In step 416, an error evaluation value $\Lambda(\alpha^i)$ is calculated by the error evaluation module 35 according to the error location polynomial.

In step 417, a decision is performed by the second determining module 36 to determine if the error evaluation value $\Lambda(\alpha^i)$ is equal to 0. If yes, this indicates that an error occurs in a symbol at the $i^{th}$ position, and step 418 is carried out to perform the necessary processing. Otherwise, the flow goes to the processing in step 420.

In steps 418 to 419, the current symbol index i (i.e., the error symbol location) is first stored in an error location memory, Location[j]=i, followed by incrementing the location index, j=j+1.

In steps 420 to 421, a decision is performed to determine if the Chien search has been completed, i.e., determining if i=n−1. If yes, the Chien search is ended. Otherwise, the symbol index i is incremented, i=i+1, and the flow returns to step 416.

Figure 6:
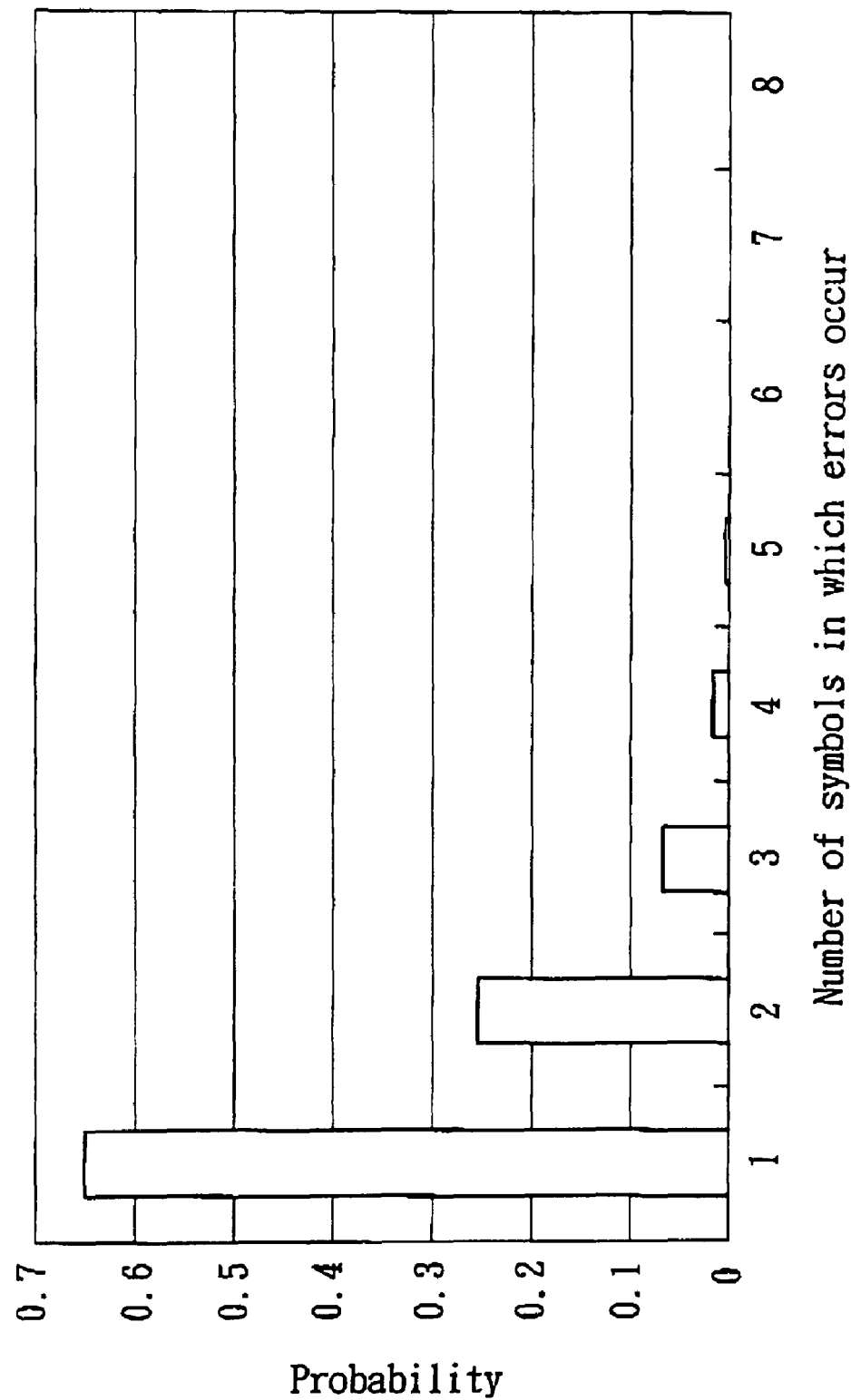
FIG. 6 is a statistical diagram to illustrate a probability distribution of number of symbols in which errors occur.

Referring to FIGS. 5 and 6, taking the DVB system of the European specification as an example, there is an approximately 90% probability that the number of symbols in which errors occur is 1 or 2, i.e., error symbol locations can be correspondingly found directly from the first error location table 33 and the second error location table 34 approximately 90% of the time for the received Reed-Solomon block codes.

In sum, by means of the present invention, error symbol locations can be found directly by table look-up for approximately 90% of the Reed-Solomon block codes. Only approximately 10% of the Reed-Solomon block codes have to undergo the time-consuming finite field multiplication and finite field addition, and the subsequent comparison and determination processing. Therefore, the time for processing the Chien search can be further reduced, which in turn increases the speed for decoding the Reed-Solomon code.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

I claim:

1. A Chien search method in Reed-Solomon decoding, which is suitable for use in a processor having a parallel processing instruction set, the method comprising the following steps:
    (a) if an error location polynomial that has been found matches a preset condition, finding at least one error symbol location according to the error location polynomial directly through table lookup, when a length of the error location polynomial is equal to a first predetermined value, looking up a pre-constructed first error location table to find said at least one error symbol location, wherein the number of said at least one error symbol location is equal to the first predetermined value;
    (b) if the error location polynomial does not match the preset condition, executing steps (c) to (e);
    (c) calculating an error evaluation value according to the error location polynomial;
    (d) if the error evaluation value is equal to 0, storing an error symbol location in an error location memory; and
    (e) if the error evaluation value is not equal to 0, the flow returning to step (c).

2. The Chien search method according to claim 1, wherein the first predetermined value in step (a) is 1.

3. The Chien search method according to claim 2, wherein, the error location polynomial having the length of 1 is expressed as $\Lambda(\alpha^i) = \lambda_0$, where $\lambda_0 \in GF(2^m)$ and $2^m$ represents a total number of corresponding elements in the Galois field, corresponding content in the first error location table in step (a) is P(k), and $0 \leq k < 2^m$, P(k) representing the error symbol location previously found when $\lambda_0 = k$.

4. The Chien search method according to claim 1, wherein step (a) further includes:
    if when the length of the error location polynomial is equal to a second predetermined value, looking up a pre-constructed second error location table to find said at least one error symbol location, wherein the number of said at least one error symbol location is equal to the second predetermined value.

5. The Chien search method according to claim 4, wherein the second predetermined value in step (a) is 2.

6. The Chien search method according to claim 5, wherein, the error location polynomial having the length of 2 is expressed as $\Lambda(\alpha^i) = \lambda_0 + \lambda_1 \alpha^i$, where $\lambda_0, \lambda_1 \in GF(2^m)$ and $2^m$ represents a total number of corresponding elements in the Galois field, corresponding content in the second error location table in step (a) is $P_0(k_0, k_1)$ and $P_1(k_0, k_1)$, and $0 \leq k_0$, $k_1 < 2^m$, $P_0(k_0, k_1)$ and $P_1(k_0, k_1)$ respectively representing two error symbol locations previously found when $\lambda_0 = k_0, \lambda_1 = k_1$.

7. An Chien search system for Reed-Solomon decoding, which is suitable for use in a processor having a parallel processing instruction set, said Chien search system comprising:
    a first determining module for determining whether an error location polynomial that has been found matches a preset condition;
    a table look-up module for finding at least one error symbol location according to the error location polynomial directly through table lookup when said first determining module determines a match with the preset condition;

an error evaluation module for calculating an error evaluation value according to the error location polynomial when said first determining module determines no match with the preset condition;

a second determining module for determining whether the error evaluation value is equal to 0;

a memory write module for storing an error symbol location in an error location memory when the error evaluation value is determined by said second determining module to be equal to 0; and a pre-constructed first error location table;

wherein, when said first determining module determines that the error location polynomial has a length equal to a first predetermined value, said table lookup module finds said at least one error symbol location from said first error location table, the number of said at least one error symbol location being equal to the first predetermined value.

8. The Chien search system according to claim 7, wherein the first predetermined value is 1.

9. The Chien search system according to claim 8, wherein, the error location polynomial having the length of 1 is expressed as $\Lambda(\alpha^i)=\lambda_0$, where $\lambda_0 \in GF(2^m)$ and $2^m$ represents a total number of corresponding elements in the Galois field, corresponding content in said first error location table is $P(k)$, $0 \leq k < 2^m$, $P(k)$ representing the error symbol location previously found when $\lambda_0 = k$.

10. The Chien search system according to claim 7, further comprising a pre-constructed second error location table, and wherein, when said first determining module determines that the error location polynomial has a length equal to a second predetermined value, said table lookup module finds said at least one error symbol location from said second error location table, wherein the number of said at least one error symbol location is equal to the second predetermined value.

11. The Chien search system according to claim 10, wherein the second predetermined value is 2.

12. The Chien search system according to claim 11, wherein, the error location polynomial having the length of 2 is expressed as $\Lambda(\alpha^i)=\lambda_0+\lambda_1\alpha^i$, where $\lambda_0,\lambda_1 \in GF(2^m)$ and $2^m$ represents a total number of corresponding elements in the Galois field, corresponding content in said second error location table is $P_0(k_0,k_1)$ and $P_1(k_0,k_1)$, and $0 \leq k_0,k_1 < 2^m$, $P_0(k_0,k_1)$ and $P_1(k_0,k_1)$ respectively representing two error symbol locations previously found when $\lambda_0=k_0, \lambda_1=k_1$.

* * * * *